(12) United States Patent
Friedrichs et al.

(10) Patent No.: US 7,082,020 B2
(45) Date of Patent: Jul. 25, 2006

(54) ELECTRONIC SWITCHING DEVICE AND AN OPERATING METHOD THEREOF

(75) Inventors: Peter Friedrichs, Nürnberg (DE); Heinz Mitlehner, Uttenreuth (DE); Reinhold Schörner, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 360 days.

(21) Appl. No.: 10/466,472

(22) PCT Filed: Jan. 3, 2002

(86) PCT No.: PCT/DE02/00004

§ 371 (c)(1),
(2), (4) Date: Jul. 16, 2003

(87) PCT Pub. No.: WO02/056472

PCT Pub. Date: Jul. 18, 2002

(65) Prior Publication Data

US 2004/0047098 A1    Mar. 11, 2004

(30) Foreign Application Priority Data

Jan. 16, 2001  (DE) .............................. 101 01 744

(51) Int. Cl.
*H02H 9/08* (2006.01)

(52) U.S. Cl. .......................... 361/93.9; 307/131; 361/5

(58) Field of Classification Search .............. 361/93.9, 361/57, 5; 307/131
See application file for complete search history.

(56) References Cited

U.S. PATENT DOCUMENTS

| | | | |
|---|---|---|---|
| 4,456,813 A * | 6/1984 | Mizuno et al. ........ | 219/130.21 |
| 4,860,146 A * | 8/1989 | Pohl et al. ................... | 361/42 |
| 4,945,266 A * | 7/1990 | Mori ........................ | 327/428 |
| 5,168,175 A * | 12/1992 | Endo ......................... | 327/430 |
| 5,195,008 A * | 3/1993 | Harr .......................... | 361/42 |
| 5,684,663 A * | 11/1997 | Mitter ....................... | 361/106 |
| 5,847,554 A * | 12/1998 | Wilcox et al. ............. | 323/282 |
| 5,986,442 A * | 11/1999 | Abe et al. .................. | 323/283 |
| 5,999,387 A * | 12/1999 | Roesch et al. .............. | 361/58 |
| 6,049,447 A * | 4/2000 | Roesch et al. .............. | 361/58 |
| 6,091,276 A * | 7/2000 | Aiello et al. ............... | 327/376 |
| 6,127,882 A | 10/2000 | Vargha et al. | |
| 6,157,049 A | 12/2000 | Mitlehner et al. | |
| 6,205,010 B1 * | 3/2001 | Ohsaka et al. ............. | 361/103 |
| 6,255,890 B1 * | 7/2001 | Aiello et al. ............... | 327/432 |
| 6,373,318 B1 * | 4/2002 | Dohnke et al. ............ | 327/427 |
| 6,525,919 B1 * | 2/2003 | Wood ....................... | 361/93.9 |
| 2002/0020849 A1 | 2/2002 | Mitlehner et al. | |
| 2004/0070276 A1 * | 4/2004 | Liu et al. .................... | 307/39 |

FOREIGN PATENT DOCUMENTS

DE    196 10 135    3/1996

(Continued)

*Primary Examiner*—Lynn Feild
*Assistant Examiner*—Michael Rutland-Wallis
(74) *Attorney, Agent, or Firm*—Harness, Dickey & Pierce, P.L.C.

(57) ABSTRACT

A switching device includes at least one MOSFET switching element and at least one JFET protective element, which is connected electrically in series to the switching element and which limits the electric current to a maximum current (saturated current) and control elements, which increase the maximum current of the JFET protective element during the closing operation or in a time-delayed manner, at least in the temporal mean, to at least a higher value and subsequently reduce said maximum current to at least a lower value. The advantage of said switching device is that it allows higher starting or closing overcurrents, which are subsequently limited.

55 Claims, 3 Drawing Sheets

FOREIGN PATENT DOCUMENTS

| | | |
|---|---|---|
| DE | 196 40 446 | 9/1996 |
| DE | 197 44 729 | 10/1997 |
| DE | 198 26 458 | 6/1998 |
| DE | 198 33 214 | 7/1998 |
| DE | 199 43 785 | 9/1999 |
| DE | 19943785 | 3/2000 |
| EP | 0 654 827 | 5/1995 |
| EP | 0654821 | 5/1995 |
| WO | WO 95/07571 | 3/1995 |
| WO | WO 95/24055 | 9/1995 |
| WO | WO 99/56373 * | 4/1998 |

* cited by examiner

ELECTRONIC SWITCHING DEVICE AND AN OPERATING METHOD THEREOF

This application is the national phase under 35 U.S.C. § 371 of PCT International Application No. PCT/DE02/00004 which has an International filing date of Jan. 3, 2002, which designated the United States of America and which claims priority on German Patent Application number DE 101 01 744.8 filed Jan. 16, 2001, the entire contents of which are hereby incorporated herein by reference.

FIELD OF THE INVENTION

The invention generally relates to a switching device and a method for operating a switching device.

BACKGROUND OF THE INVENTION

In order to supply an electrical load (apparatus, load element), in particular an electrical drive or motor, with electrical energy or power, the load is generally connected to a line branch of an electrical supply network via a switching apparatus (a switching device) for switching the electric current on and off.

For switching electric currents, there are known, not only the predominantly used mechanical switching apparatuses with switching contacts but also electronic switching apparatuses realized with semiconductor components. Such semiconductor components can be subdivided into current controlled semiconductor components, including bipolar transistors and thyristors on the one hand, and voltage-controlled semiconductor components such as, for example, the unipolar MOS (Metal Oxide Semiconductor) field-effect transistors (MOSFET) or the bipolar MOS-controlled thyristors (MCT) or the MOS-controlled bipolar transistors (IGBT) on the other hand. All the semiconductor components mentioned can only move currents in a current direction (forward direction), i.e. only be switched between an on state and an off state given a specific polarity of the operating voltage present (switchable state). In its off state, each semiconductor component can only block up to a maximum reverse voltage (breakdown voltage). At higher reverse voltages, a charge carrier breakdown takes place, which can rapidly lead to the destruction of the component.

In normal continuous operation (rated operation) of the load, the switching apparatus switches the rated currents required for the electrical load. However, in the event of overloading of the load, for example in the event of switch-on or start-up, there is an increase in the current consumption and thus in the electrical power loss in the load. An overload occurring for an excessively long time jeopardizes the load, for example the motor windings, through overheating. The electric currents flowing through the switching apparatus in such an overload situation may be significantly higher than the rated current and are referred to as overcurrents or overload currents. In the event of motor start-up, by way of example, the start-up currents may assume a value during the start-up time which is up to twelve times higher than the rated current in normal continuous operation.

An even more extreme situation jeopardizing the load and the switching apparatus is a short circuit in the electrical load or in the lines leading to the load, for example, as a result of insulating faults. In the short-circuit situation, very high short-circuit currents occur, which leads very rapidly to thermal damage and usually to the destruction of the load or of parts thereof or of the switching apparatuses themselves.

Consequently, the loads and also, particularly when using semiconductor components, the switching apparatuses must be protected from overcurrents or short-circuit currents flowing over an excessively long period of time. To that end, use is made of special protection apparatuses which, in order to protect the load from excessively high currents, isolate the line branch from the supply network if such a critical current occurs. By way of example, fuses or mechanical protective circuit-breakers with thermal and electromagnetic overcurrent releases can be used as protection apparatuses having such overcurrent or short-circuit current disconnection.

Overload- or short-circuit-proof switching apparatuses with semiconductor components are also known. In this case, it is possible to differentiate between electronic protective circuit-breakers which operate actively with an auxiliary energy and passive, autonomously operating, so-called intrinsically safe electronic protective circuit-breakers.

WO 95/24055 A1 discloses an electrical switching device in which a semiconductor component with two FETs reverse-connected in series and a respective interrupter contact at both sides of the semiconductor component are connected into a line run. The interrupter contacts are switched on or off by a release element connected in parallel with the semiconductor component. A control voltage of a control device is present between gate and source of the two FETs. A current sensor, to which the control device is connected, is arranged in the line run. The control device checks when a permissible short-circuit current is reached or exceeded and then sets the control voltage for the two FETs in such a way that the permissible short-circuit current is not exceeded, by increasing the internal resistance of the FETs by way of the control voltage. The control device generates the control voltage with the aid of an auxiliary energy (extraneous energy). The signal of the current sensor serves only for evaluation of when a short-circuit situation is or is not present.

WO 95/07571 A1 discloses an AC power controller with two silicon-carbide-based MOSFETs, reverse-connected in series. Each SiC-MOSFET can be driven by way of its own gate-source control voltage. According to information in this document, the gate-source voltage is set such that, in the forward direction, it is so large that desired limiting of the drain-source current is established and, in inverse operation, it is only so large that the inner body diodes of the MOSFETs are still currentless. By virtue of the current-limiting property of this circuit, short-circuit currents can be limited to an acceptable level and lowered by way of correspondingly continuously reduced gate-source voltages. The gate-source voltages are generated with the aid of an external energy source.

DE 196 10 135 C1 discloses an intrinsically safe, passively protected or protective electronic switching device having two electrical terminals for applying electrical operating voltages, a silicon-based semiconductor component as switching element and, in addition, a semiconductor arrangement having a high blocking capability as protection element. The protection element includes a first semiconductor region of a predetermined conduction type and at least one further semiconductor region of the opposite conduction type, between which a pn junction is formed in each case. The semiconductor regions are in each case formed with a semiconductor having a breakdown field strength of at least $10^6$ V/cm, in particular diamond, aluminum nitride (AlN), gallium nitride (GaN), indium nitride (InN) and preferably silicon carbide (SiC), in particular the polytypes 3C, 4H and/or 6H.

At least one channel region—adjoining the pn junction—in the first semiconductor region of the protection element is then electrically connected in series with the silicon switching element between the two terminals. The switching element has an on state and an off state given operating voltages of a predetermined polarity. The pn junction of the protection element is electrically connected between the two terminals in the reverse direction for the operating voltages. If the switching element is in its off state, the depletion zone of the at least one pn junction pinches off the channel region in the first semiconductor region of the protection element. As a result, in the off state of the switching element, the largest proportion of the operating voltage between the two terminals is already dropped across the depletion zone of the pn junction. On account of the high breakdown field strength of at least $10^6$ V/cm of the semiconductor provided for the semiconductor regions of the pn junction, the pn junction of the protection element can carry significantly higher reverse voltages than a pn junction formed in silicon and having identical charge carrier concentrations and dimensions. For comparison, the breakdown field strength of silicon is approximately $2 \cdot 10^5$ V/cm.

The silicon switching element therefore only has to be designed for the remaining part of the reverse voltage between the two terminals. This in turn results in a significantly reduced power loss of the silicon switching element in forward operation. At the pn junction of the protection element, furthermore, in the other circuit branch, the entire operating voltage between the two terminals is present as reverse voltage. In the on state of the silicon component, the channel region in the first semiconductor region of the protection element is opened again and an electric current can then flow between the two terminals through the channel region.

A silicon power MOSFET, preferably of the normally off type, or else a MESFET (Metal Semiconductor Field Effect Transistor) is proposed as the switching element. The protection element is preferably designed as a vertical JFET (Junction Field Effect Transistor). The source of the JFET is short-circuited with the drain of the silicon MOSFET. The drain of the JFET is electrically connected to the second terminal of the electronic switching device. The gate of the JFET is electrically short-circuited with the first terminal of the electronic switching device and the source of the silicon MOSFET. With such a known electronic device, which can be referred to as a hybrid power MOSFET or cascode circuit, it is possible to achieve, in particular, reverse voltages of up to 5000 V and forward currents of between 5 A and 5000 A if silicon carbide (SiC) is used as semiconductor material for the protection element. If, in a further embodiment of the electronic device disclosed in DE 196 10 135 C1, a protection element of an IGBT-like hybrid based on silicon carbide (SiC) is combined with a silicon MOSFET, then it is possible to achieve reverse voltages of up to 10 000 V and rated currents of between 100 A and 1000 A.

The further document DE 198 33 214 C1 discloses a JFET protection element constructed as a mesa structure with epitaxial layers, preferably based on silicon carbide (SiC), as switching element. This JFET protection element having a high blocking capability is proposed particularly for converter applications for variable-speed drives or as AC voltage switches of motor branches in which the switching components have to be operated in "normally off" fashion, i.e. are intended to automatically undergo transition to the blocking state in the event of current failure. To that end, it is proposed to connect the JFET protection element having a high blocking capability in a cascode circuit with a low-voltage MOSFET or low-voltage Smart MOSFET, it being possible to produce the low-voltage FET using known silicon technology.

A so-called intrinsically safe switching device is realized both with the cascode circuit disclosed in DE 196 10 135 C1. Further, in the case of the cascode circuit described in DE 198 33 214 C1, which switching device protects itself and the line branch automatically without an additional auxiliary energy supply and limits short-circuit currents or overload currents to the saturation current of the protection element, in particular the JFET.

In the case of the switching device disclosed in DE 196 10 135 C1 or DE 198 33 214 C1, a problem is posed by the fact that the start-up current or switch-on current required in the event of the start-up operation for an electrical drive or generally in the event of the switch-on of a load may lie in an overload range. What occurs in this case, then, is a situation of a regular overload that is assessable or limited in respect of time or in terms of the current intensity as a normal operating state which can be tolerated in contrast to irregular overload situations with unpredictable duration and overcurrent intensity. In the last-mentioned irregular overload situations, however, the protection element is then intended to limit the current to its saturation current in order to prevent damage to the load.

Therefore, if the protection element is designed in such a way as to achieve overload protection from irregular overloading, then the start-up or switch-on currents required by the load cannot be provided or switched through by the switching device, as a result of which, in turn, proper operation of the load is not possible. If, on the other hand, the protection element is conversely dimensioned such that the saturation current is higher than the start-up current or switch-on current, then the protection element no longer protects the load and the switching element in irregular overload situations in which overcurrents comparable to the start-up currents or switch-on currents flow. The protection component is then to be derated only for the momentary start-up or switch-on operation. For protection from irregular overload situations as well, it is necessary, moreover, to have an additional identification and processing assembly which detects and controls such overload situations separately from the start-up or switch-on situation. However, it would be desirable to use a single protection or switching device to control both the high currents in the event of start-up or switch-on and the current limiting in the event of overload or short-circuit.

SUMMARY OF THE INVENTION

An embodiment of the invention may be based on an object of specifying a switching device and a method for operating a switching device in which the disadvantages mentioned in the case of the prior art are avoided or at least alleviated.

An embodiment of the invention is based on a switching device having at least one switching element, which can be switched back and forth between a switched-off state and a switched-on state, generally by way of a corresponding switching signal present at at least one switching terminal, and including at least one protection element, which is electrically connected in series with the switching element and limits the electric current, in a current-limiting state (saturation state), to a maximum current (limiting current, saturation current). By virtue of this current limiting, the protection element protects the switching element in the switched-on state from an excessively high thermal loading in a jeopardizing situation in which excessively high prospective overcurrents or short-circuit currents would flow through the switching element and would thermally jeopardize the switching element due to the resulting joule heat loss.

An embodiment of the invention, then, is based on the first conceptual step of using a protection element with a maximum current whose value is controllable (settable, variable) and of providing a control (setting) of the maximum current. Generally, the maximum current then depends on a control signal which is present at a control terminal of the protection element and is generated by a controller.

An embodiment of the invention is based on the second conceptual step of designing the control of the maximum current in such a way that the maximum current of the protection element, at the point in time at which the switching element undergoes transition to the switched-on state, or a predetermined time duration after this switch-on point in time, at least on average with respect to time, assumes at least one increased (higher, raised) value, that is to say, is increased (made larger in its magnitude), if the maximum current was previously at a lower value or, if the maximum current was previously already at an increased value, is held at at least one increased value. Thus, the current-limiting action of the protection element occurs, at the same time as or temporally offset with respect to the switch-on of the switching element, only in the event of correspondingly larger currents. Consequently, through adaptation of the maximum current of the protection element, higher start-up currents or switch-on currents which occur in the event of or after the switch-on of the switching element, can be permitted as a regular overload.

In this case, it suffices for the maximum current to be higher only on average with respect to the time, since only the time integral matters in the case of the electrical energy conducted by the protection element, and values of the maximum current that are momentarily lower in individual time intervals are therefore unimportant as long as these lower values are integrally compensated for by higher values in other time intervals. As a result, besides a simple changeover between two discrete values of the maximum current namely a higher value for the start operation and a low value for the continuous operation, a multiplicity of other temporal profiles of the maximum current are also conceivable, for example, time-dependent profiles that are continuous and/or rise or fall monotonically or strictly monotonically and/or ascend or descend with a superposed oscillation.

Later, after the end of a start-up or switch-on operation (start operation) overcurrents occurring in irregular overload situations are limited to a greater extent again, by the maximum current then again being controlled in such a way that the maximum current lies in a lower normal range, that is to say is lowered (reduced, decreased).

Through this control of the maximum current and thus of the current-carrying capacity of the protection element according to an embodiment of the invention, both overload and short-circuit protection and start-up or switch-on operations can thus be taken into account using a single switching device comprising a switching element and a protection element.

In a first embodiment, the maximum current can be increased by abrupt change to a single, discrete, higher value or else, in a second, more generally usable embodiment, can also be altered in accordance with a predetermined time profile, in particular as a preferably continuous function of time, in which case the then varying values of the maximum current are intended to be, at least predominantly or on average with respect to time, above the maximum current set before the switch-on of the switching element. The maximum current of the protection element is preferably kept increased for a predetermined or predeterminable time duration.

This predetermined or predeterminable time duration and/or the predetermined time profile and/or the magnitude of the increased maximum current are generally adapted to the desired corresponding quantities in the event of the start-up or start—characterized by an increased energy demand—of an electrical load, in particular of an electrical drive, connected downstream of the switching device. That is to say, the time interval is adapted to the desired start-up time or switch-on time (start time), the increased value of the maximum current is adapted to the start-up or start current and the time profile is adapted, if appropriate, to a temporally changing energy demand, in order to achieve the best possible adaptation. The corresponding control can easily be realized, using a suitable driver circuit as control means for the protection element.

A particularly simple time profile for the maximum current of the protection element is a binary changeover by abrupt change (short switching edges) between precisely one lower value and precisely one increased value. However, it is also possible to switch back and/or forth between the low and the high value of the maximum current continuously (with a certain time constant and larger transition regions), in particular in the event of the maximum current being reset to the lower value.

After the end of the phase during which the maximum current of the protection element is or has been increased, the maximum current is reduced again. The reduced value of the maximum current is chosen then, in such a way as to ensure reliable protection from irregular overcurrents (overload protection and short-circuit protection). To that end, the at least one lower value of the maximum current of the protection element is adapted to the maximum permissible overcurrent of the electrical load in operation after the end of the start-up or start of the electrical load or is chosen at most to be as large as the overcurrent.

The at least one increased value of the maximum current of the protection element is preferably chosen to be significantly lower than a prospective short-circuit current in order not to be surprised by a short circuit during the start-up or start phase, in which the protection element is more current-conductive. The ratio of the at least one increased value and the at least one lower value of the maximum current of the protection element is preferably at least 2, preferably at least 3.

In a preferred embodiment, for providing the control signal for increasing the maximum current of the protection element, the controller may include at least one chargeable capacitor and preferably a connected, preferably parallel-connected, discharge resistor. The capacitor is then discharged in the event of or after the switch-on of the switching element in accordance with a predetermined time constant and thereby generates a control signal for the protection element which falls correspondingly, generally exponentially. Later, preferably in the event of the switch-off of the switching element, or after a predetermined time duration has elapsed after the switch-off of the switching element, the capacitor is charged again by way of an auxiliary energy source (charging means).

In order to separate discharging operation and charging operation, in an advantageous embodiment, a charging switch is connected between the auxiliary energy source and the capacitor and/or a discharge switch is connected between the capacitor and the control terminal of the protection element and also the discharge resistor. The charging switch and/or discharge switch can be switched together with the switching element. In this case, the charging switch is in its switched-off state and/or the discharge switch, if appropriate with a predetermined time delay, is in its switched-on state if the switching element is in its switched-on state. By contrast, if the switching element is in its switched-off state, then the charging switch is in its switched-on state and/or the discharge switch is in its switched-off state. For this joint switching of charging switch and/or discharge switch with the switching element, the switching signal generating means which apply a switching signal for the changeover of the switching element to the switching terminal of the switching element are also connected to associated switch terminals of discharge switch and charging switch.

In a particularly advantageous embodiment, the charging switch and/or the discharge switch of the control means comprises at least one transistor, preferably a MISFET (Metal Insulator Semiconductor Field Effect Transistor), in particular a MOSFET. The switching signal is then a control potential or a control voltage between gate and source. The use of a normally off MISFET or MOSFET (enhancement type) is particularly advantageous. Given a control voltage of 0 V, such a normally off MISFET is in the blocking (switched-off) state and, for the switch-on or transition to the on state, requires an active switching or control voltage whose magnitude is greater than 0 V and which must generally lie above a threshold voltage.

The control transistor may also be a (current-controlled) bipolar transistor (of the npn or pnp type) or a (voltage-controlled) IGBT (Insulated Gate Bipolar Transistor). Furthermore, another switchable component or semiconductor component, for example a thyristor or an MCT (MOS Controlled Thyristor) may also be used as control switch.

What is particularly suitable as protection element is an electronic component, in particular a semiconductor component, which exhibits a saturation behavior, that is to say in which, in the current/voltage characteristic curve, in the forward region, the current approximates to or assumes a saturation current (maximum current value) as maximum current with rising voltage. The maximum current or saturation current of the protection element is preferably less, for example by a factor of at least 2 or even at least 3, than the thermal limiting current of the switching element. The thermal limiting current is the maximum permissible current at which thermal destruction still does not take place.

By virtue of its current-limiting property in an overload or short-circuit situation (jeopardizing situation), the protection element accepts the predominant proportion of the operating voltage dropped across the series circuit and, correspondingly, also the predominant proportion of the joule losses. By contrast, in the case of a load operated in normal operation (rated operation, continuous operation) without any overload and short circuit and with the corresponding, significantly lower rated currents, the protection element is intended to have the least possible forward losses.

Therefore, the ratio of the voltage dropped across the protection element and the voltage dropped across the switching element, and thus also the ratio of the joule power loss liberated in the protection element and the joule power loss liberated in the switching element, are chosen to be significantly smaller in rated operation than in the jeopardizing situation. To put it another way, the proportion of the voltage drop accepted by the protection element, and thus of the joule thermal output, increases to a correspondingly great extent owing to the current limiting in the jeopardizing situation compared with rated operation. It is also possible, in particular, to hold the absolute value of that part of the operating voltage which is dropped across the switching element below a predetermined maximum value, for example 100 V or else 50 V.

Since the protection element should thus have the highest possible thermal loadability in the jeopardizing situation and also in the start-up or start phase, the electronic protection element is preferably formed on the basis of at least one semi-conductor which comprises a breakdown field strength of at least $10^6$ V/cm and/or a band gap of at least 2 eV and is thus suitable for blocking relatively high voltages. As a result, the protection element can carry a particularly high proportion of the operating voltage in the jeopardizing situation or be used for higher operating voltages given a predetermined maximum current for the current limiting. Suitable semiconductor materials are silicon carbide (SiC), in particular of the β polytype (3C) or of an α polytype, for example 15R, 4H or 6H polytype, gallium nitride (GaN), diamond, aluminum nitride (AlN) and indium nitride (InN). The preferred semiconductor material is silicon carbide (SiC), owing to its extremely low intrinsic charge carrier concentration, its high breakdown strength, low power loss, high thermal stability, chemical resistance and high thermal conductivity. However, the protection element may also be formed from another semiconductor, for example silicon.

The switching element is also preferably formed with a semiconductor component. Since for the switching element, the best possible switching behavior is of primary importance, and to a lesser extent the dielectric strength, which is largely undertaken by the protection element, the electronic switching element is preferably constructed on the basis of one or more semiconductors from the group of semiconductors comprising silicon (Si), gallium arsenide (GaAs) and germanium (Ge). In principle, SiC is also possible as a semiconductor material for the switching element.

The protection element can carry the reverse voltage that is present by way of at least one reverse-biased pn junction and/or at least one Schottky junction. The formation of depletion zones for blocking the voltage is characteristic of each of said junctions.

Preferred component structures for the protection element and/or the switching element are JFET (Junction Field Effect Transistor), MESFET (Metal Semiconductor Field Effect Transistor) and/or MISFET, in particular MOSFET, structures.

In a particularly advantageous combination, the protection element is equipped with a JFET structure or a MESFET structure and the switching element is equipped with a MISFET structure. Then, in the operating circuit, the gate terminal of the JFET structure or MESFET structure of the protection element is connected to the source terminal of the MISFET structure of the switching element, preferably via the discharge resistor in a modification of the known cascode circuit, and the source terminal of the JFET structure or MESFET structure of the protection element is connected to the drain terminal of the MISFET structure of the switching element.

In an advantageous application, the switching device is connected into a line branch, in particular a line branch of an electrical supply network such as a low-voltage network (typically between 230 V and 690 V root mean square value), upstream of an electrical load. On the one hand, it switches the rated currents for the load and on the other hand, it isolates the load from the network in good time in the overload situation or short-circuit situation and thus prevents damage to the load. If the operating voltage present across the series circuit including switching element and protection element is a time-variable voltage which alternates in its polarity, for example, alternates periodically (AC voltage) as is usually provided by electrical energy supply networks or electrical generators, then preferably two switching devices according to the invention are connected into the line branch in a manner reverse-connected in series, that is to say in series with an opposite switching direction or polarity.

BRIEF DESCRIPTION OF THE DRAWINGS

For further explanation of the invention, reference is made to the drawings, in which FIG. 1 schematically illustrates an embodiment of a switching device with a protection element with a controllable saturation current, FIG. 2 schematically illustrates a diagram with current/voltage characteristic curves with different saturation currents of the protection element in accordance with FIG. 1, FIG. 3 schematically illustrates a diagram with two time profiles for the maximum current $I_{max}$ of the JFET protection element in accordance with FIG. 1, and FIG. 4 schematically illustrates a diagram with a further time profile of the maximum current $I_{max}$ of the JFET protection element in accordance with FIG. 1.

Mutually corresponding parts or quantities are provided with the same reference symbols in FIG. 1 to FIG. 4.

DETAILED DESCRIPTION OF THE PREFERRED EMBODIMENTS

Figure 1:
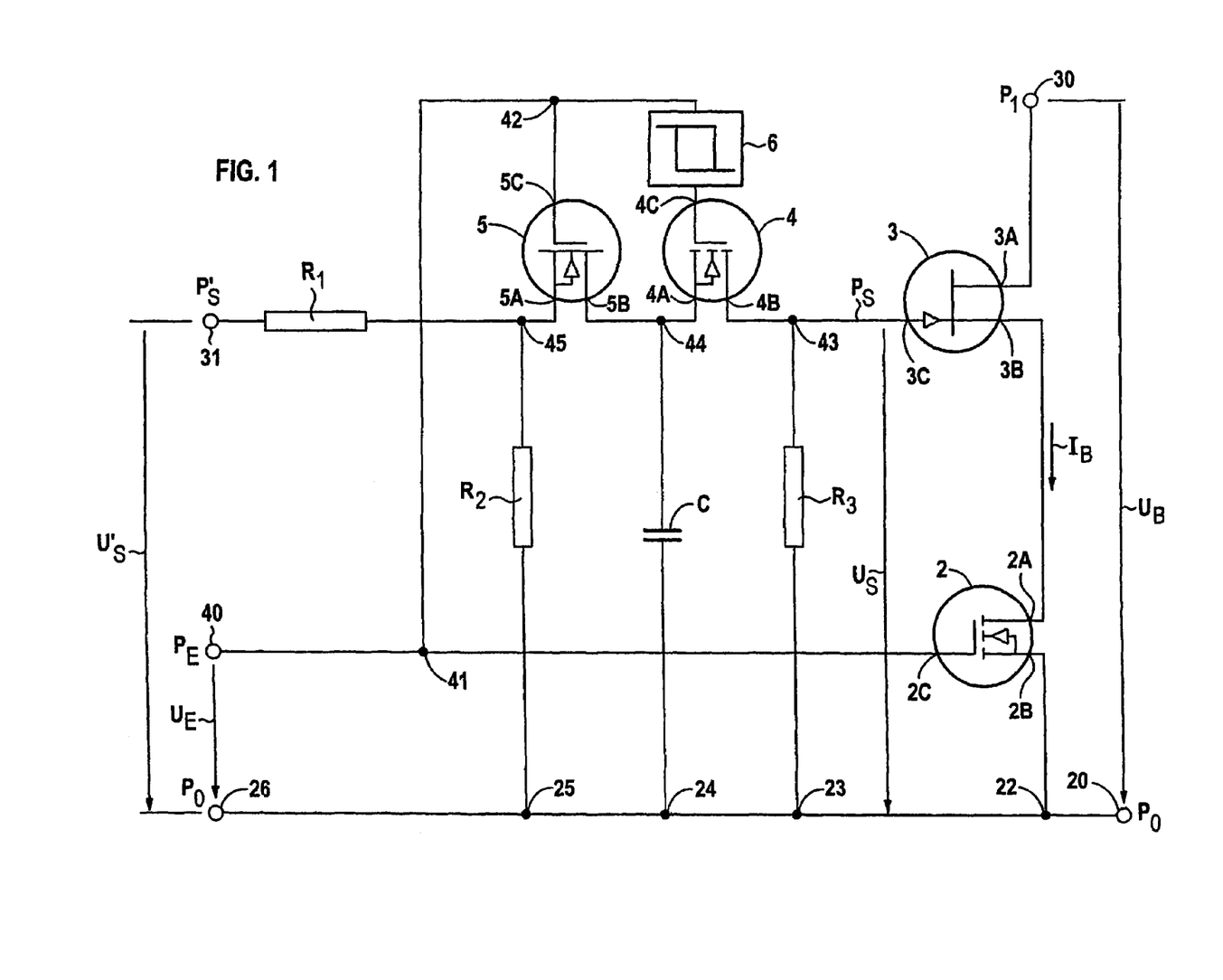

The switching device in accordance with FIG. 1 comprises a cascode circuit comprising a JFET, preferably a vertical JFET or V-JFET as protection element 3 and a MOSFET as switching element 2. The source 2B of the MOSFET switching element 2 is connected to a switching point 22 connected to the terminal 20, the drain 2A of the MOSFET switching element 2 is connected to the source 3B of the JFET protection element 3 and the source 3A of the JFET protection element 3 is connected to the terminal 30. The gate (control terminal) 3C of the JFET protection element 3 is connected to a switching point 43, which is connected via an interposed discharge resistor $R_3$ to a switching point 23, which is in turn short-circuited with the switching point 22. Thus, the source-drain paths of the JFET protection element 3 and of the MOSFET switching element 2 are connected in series with one another and this series circuit is connected in parallel with the series circuit including source-gate junction of the JFET protection element 3 and discharge resistor $R_3$ between the terminals 20 and 30.

The switching points 22 and 23 and the further switching points 24 and 25, just like the terminal 20, are electrically at the same potential $P_0$. The second terminal 30 is at a potential $P_1$. An operating voltage $U_B = P_1 - P_0$ is applied or can be applied between the two electrical terminals 20 and 30. The potential $P_0$ is generally essentially constant, in particular ground potential, while the potential $P_1$ corresponds to the active phase.

The control potential present at the gate 3C of the JFET protection element 3 is designated by $P_S$, and the voltage dropped across the discharge resistor $R_3$, as control voltage of the JFET protection element 3, is designated by $U_S = P_S - P_0$.

A switching potential $P_E$ of a switching input 40 is applied to the gate 2C of the MOSFET switching element 2. The gate-source voltage of the MOSFET switching element 2 is the corresponding switching voltage $U_E = P_E - P_0$ for switching the switching element 2 formed by the MOSFET. The MOSFET switching element 2 is of the normally off type, so that, at a switching voltage $U_E = 0$ volts (V), the MOSFET switching element 2 is in the switched-off state and it is only at a switching voltage $U_E$ which is greater than a specific threshold value that the MOSFET switching element 2 is turned on and undergoes transition to its conducting or switched-on state.

With switching element 2 switched on, charge carrier injection also cancels the off state in the channel region of the JFET protection element 3. It is possible for an operating current $I_B$ to flow through the series circuit including JFET protection element 3 and MOSFET switching element 2.

This cascode circuit in accordance with FIG. 1 differs from the known cascode circuit described in DE 196 10 135 C1 in terms of the discharge resistor $R_3$ connected between gate 3C of the JFET protection element 3 and the source 2B of the MOSFET switching element 2. Exemplary embodiments of the JFET protection element 3 are described in DE 196 10 135 C1 and also DE 198 33 214 C1. The disclosure content of both documents DE 196 10 135 C1 and DE 198 33 214 C1 is concomitantly incorporated by reference, in its entirety, into the content of the present application.

The behavior of the protection element (JFET) 3 given the presence of an operating forward voltage $U_B$ between drain 3A and source 3B is dependent on the electric operating current $I_B$ flowing through the JFET protection element 3 and on the control voltage $U_S$ present at the gate 3C, which is directly correlated with respect to the gate-source voltage of the JFET protection element 3.

Figure 2:
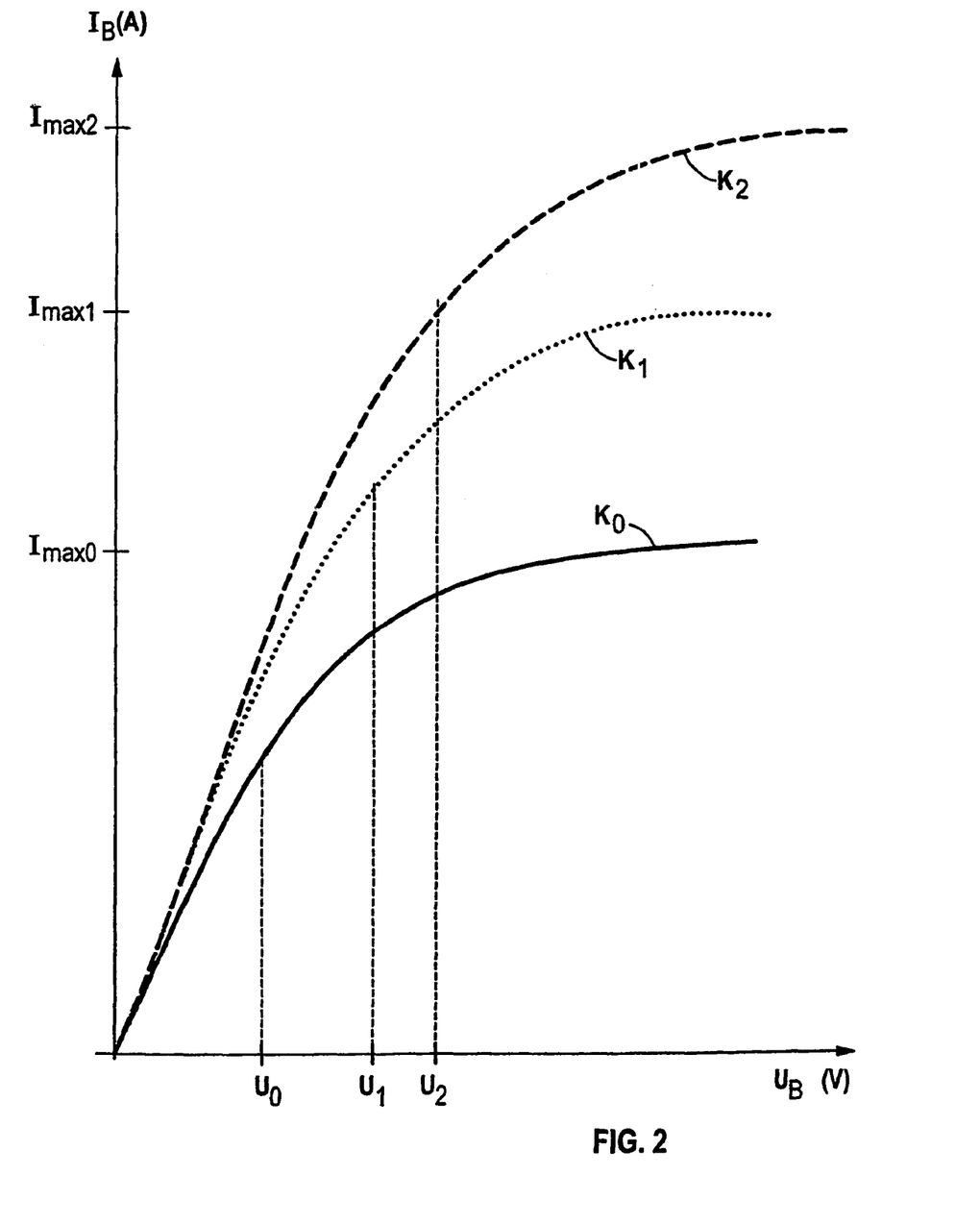

Various current-voltage characteristic curves of the JFET protection element 3 for different control voltages $U_S$ are illustrated in FIG. 2. In the diagram in accordance with FIG. 2, the operating current $I_B$ flowing through the JFET protection element 3 between drain 3A and source 3B is a function of the drain-source voltage $U_B$ present between drain 3A and source 3B. A characteristic curve $K_0$ for the function $I_B(U_B)$ at a control voltage $U_S = 0$ V, a second characteristic curve $K_1$ for the function $I_B(U_B)$ at a control voltage $U_S = U_{S1} > 0$ V and a third characteristic curve $K_2$ at a control voltage $U_S = U_{S2} > U_{S1}$ are shown.

Given normal operating currents (rated currents) in rated operation, the JFET protection element 3 has a low forward resistance and a practically linear ohmic characteristic curve. This ohmic region ranges from $U_B = 0$ V to about $U_B = U_0$ in the case of the characteristic curve $K_0$, from $U_B = 0$ V to about $U_B = U_1$ in the case of the characteristic curve $K_1$ and from $U_B = 0$ V to about $U_B = U_2$ in the case of the characteristic curve $K_2$. It can be seen that the upper interval limit of the ohmic region likewise increases as the control voltage $U_S$ rises, that is to say $U_2 > U_1 > U_0$ holds true.

As the operating current $I_B$ rises further or as the operating voltage proportion $U_B$ rises further at the JFET protection element 3, the extent of the depletion zone of the pn junction or junctions increases and the current-carrying capacity of the channel region of the JFET protection element 3 thus decreases. The forward resistance thus increases and the gradient of the characteristic curve decreases more and more. When a specific critical current value (saturation current) is reached, the JFET protection element 3 attains saturation as a result of complete pinch-off of the channel region and remains at the saturation current value as maximum current $I_{max}$ with the voltage remaining the same or else rising further. This saturation current $I_{max}$ increases as the control voltage $U_S$ rises, and is designated by $I_{max0}$ in the case of the characteristic curve $K_0$, $I_{max1}$ in the case of the characteristic curve $K_1$ and $I_{max2}$ in the case of the characteristic curve $K_2$. $I_{max0} < I_{max1} < I_{max2}$ thus holds true.

The JFET protection element 3 thus limits the flowing current to a maximum current $I_{max}$ which depends on the control signal (potential) $P_S$ present at the control terminal (gate) 3C of the protection element 3 and on the corresponding control voltage $U_S$. This current limiting property is utilized for the overcurrent protection function. To that end, the maximum current $I_{max}$ of the protection element 3 is typically set to a maximum permitted overload current of an electrical load (not illustrated) which is or has been connected downstream of the switching device at the terminal 30. As a result, the protection element 3 protects the electrical load and also the switching element 2 from unforeseen overload situations (irregular overload situations) and short-circuit situations that possibly occur in continuous operation.

However, in the event of the start-up operation of an electric motor or drive or generally in the switch-on or start operation of an electrical load, start-up currents or start currents that are significantly above the rated currents in continuous operation occur in order to provide the drive or load with a higher energy. These start-up currents or start currents often lie above the maximum permitted overload currents in continuous operation, and thus actually constitute overcurrents that are not permitted. Therefore, given a fixedly set maximum current, the protection element 3 would not permit the required start-up currents or start currents at all, with the result that a proper start-up or start operation for the drive or load would be impeded or even precluded.

For this reason, according to an embodiment of the invention, during the start-up operation or start operation for the electrical load, the maximum current $I_{max}$ of the protection element 3 (saturation current of the JFET) is temporarily increased in order to conduct the higher start-up currents or start currents. To that end, the gate 3C of the JFET protection element 3 is positively biased, that is to say a control potential $P_S > P_0$ or a control voltage US>0 V is applied, over an adjustable period of time corresponding to the respective application. As has already been explained with reference to the diagram in FIG. 2, this leads to a significant increase in the saturation current or maximum current $I_{max}$ and furthermore reduces the losses in the protection element 3 during the start-up or start operation owing to its lower forward resistance (on resistance). After the conclusion of the start-up or start process, the JFET protection element 3 is reset to its normal characteristic curve, in that the gate voltage $U_S$ is returned to 0 V (volts) again, and can then reliably intercept further critical states in normal operation (rated operation). As a result, the components for the protection element 3 and the switching element 2 no longer have to be derated since the difference separating rated current and start-up current or start current is reduced.

FIG. 1 shows a special circuit—impressive because of its simple construction—for generating a control potential $P_S$ at the control terminal 3C of the protection element 3 for increasing the maximum current (saturation current) $I_{max}$ of the protection element (JFET) 3. The control circuit applies a positive control potential $P_S$ or a positive control voltage $U_S$ to the control terminal 3C (gate) of the JFET protection element 3 in order to raise the maximum current $I_{max}$. Apart from the control circuit in accordance with FIG. 1, however, other control circuits or driver circuits are also possible, in principle, in order to provide additional current via the gate 3C of the JFET protection element 3. The control circuit in accordance with FIG. 1 is constructed, then, as follows.

At the switching point 43, which is directly connected to the control terminal 3C of the protection element 3, the discharge resistor $R_3$ and a discharge switch 4 are connected in parallel with one another. A normally off MOSFET whose drain 4B is connected to the switching point 43 and whose source 4A is connected to a further switching point 44 is provided as discharge switch 4. A control capacitor C is connected between said further switching point 44 and the switching point 24, which is at the potential $P_0$. Likewise electrically connected to the switching point 44 is a charging switch 5, which is preferably designed as a normally on MOSFET and is electrically connected to the switching point 44 by its drain 5B and to a further switching point 45 by its source 5A. An input potential $P_S'$ is connected to the switching point 45 via an input resistor $R_1$, said input potential being present as auxiliary energy at a control input 31. The input voltage present between the control input 31 and the switching point 26, which is at the potential $P_0$ is $U_S' = P_S' - P_0$. The input voltage $U_S'$ may be +12 V, for example. The input resistor $R_1$ and decoupling resistor $R_2$, connected to one another via the switching point 45, form a voltage divider via which a lower voltage, for example 2.5 V, is present at the decoupling resistor $R_2$.

The switching potential $P_E$ at the switching input 40, which is present at the switching terminal 2C of the switching element 2, is then also connected in parallel, via a switching point 41 and a further switching point 42, to the control terminal 5C of the charging switch 5 and the control terminal 4C of the discharge switch 4. Moreover, as illustrated, a delay element 6 may be connected between the switching point 42 and the control terminal 4C of the discharge switch 4.

If the switching voltage $U_E$, which corresponds to the gate-source voltage of the MOSFET switching element 2, lies below the threshold voltage of the MOSFET switching element 2, in particular is thus 0 V, then the switching element 2 is in its switched-off state and, at the latest after the time delay effected by the delay element 6 has elapsed, the discharge switch 4 is also in its blocking state. By contrast, the same control potential $P_E$ which is a switch-off signal for the discharge switch 4 is a switch-on signal for the normally on charging switch 5. The charging switch 5 is therefore in its conducting or switched-on state if the switching element 2 is also in the switched-off state. As a result, a conducting connection is produced between the terminals 5A and 5B of the charging switch 5, so that the control capacitor C is charged via the control input (auxiliary energy source) 31 until the voltage present at the capacitor surfaces of said control capacitor corresponds to the voltage dropped across the decoupling resistor $R_2$.

If the switching potential $P_E$ at the switching input 40 then changes over to a value at which the switching voltage $U_E$ is greater than the threshold voltage of the switching element 2, then the switching element 2 is switched on and, at the same time, the charging switch 5 is switched off. The characteristic curve of the charging switch 5 is chosen correspondingly, so that the same switching potential $P_E$ which turns on the MOSFET switching element 2 switches off the MOSFET charging switch 5, so that the charging switch 5 decouples the switching points 45 and 44 from one another. At the same time, the switching potential $P_E$ which switches on the switching element 2 also switches on the discharge switch 4 in a manner time-delayed by way of the delay element.

The time delay by way of the delay module 6 is not absolutely necessary, but ensures a clean separation between the switch-off of the charging switch 5 and the switch-on of the discharge switch 4. Since the discharge switch 4 is now in its conducting state, a conducting connection between the switching points 44 and 43 is produced between the terminals 4A and 4B of the discharge switch 4. The charges stored on the capacitor C can now flow away via the discharge resistor $R_3$. This discharging of the control capacitor C leads to a control potential $P_S$ at the control terminal 3C of the protection element 3 and a corresponding control voltage $U_S = P_S - P_0$. The discharging time and thus the temporal profile of the control potential $P_S$ at the control terminal 3C of the protection element 3 can be set through the choice of the capacitance of the control capacitor C and the electrical resistance of the discharge resistor $R_3$. The control potential $P_S$, which is positive with respect to $P_0$, then leads to a driving of the depletion zone and an extension of the channel region of the JFET protection element 3, so that the operating current $I_B$ flowing between the terminals 3A and 3B of the JFET protection element 3 can assume larger values. At the same time, the saturation current or maximum current $I_{max}$ of the JFET protection element 3 is increased and the ohmic region and thus the forward resistance is reduced for currents below the saturation current.

In other words, in the switched-off state of the switching element 2, the charging switch 5 is open and the control capacitor C is charged via the voltage divider with $R_1$ and $R_2$. The discharge switch 4 is closed, so that the gate 3C of the JFET protection element 3 is at the preferably constant potential $P_0$ via the discharge resistor $R_3$. If the cascode is then switched on, that is to say the switching element 2 is brought to its switched-on state, then the charging switch 5 closes and decouples the voltage divider $R_1$ and $R_2$ from the control capacitor C. The discharge switch 4 is opened via the delay module 6. The control capacitor C is thus connected to the gate 3C of the JFET protection element 3 and biases the latter. By way of the RC time constant formed from the discharge resistor $R_3$ and the control capacitor C, the control capacitor C discharges and the bias voltage slowly decreases. The desired time can be adapted to the respective requirements through a suitable choice of the discharge resistor $R_3$ and of the control capacitor C.

Figure 3:
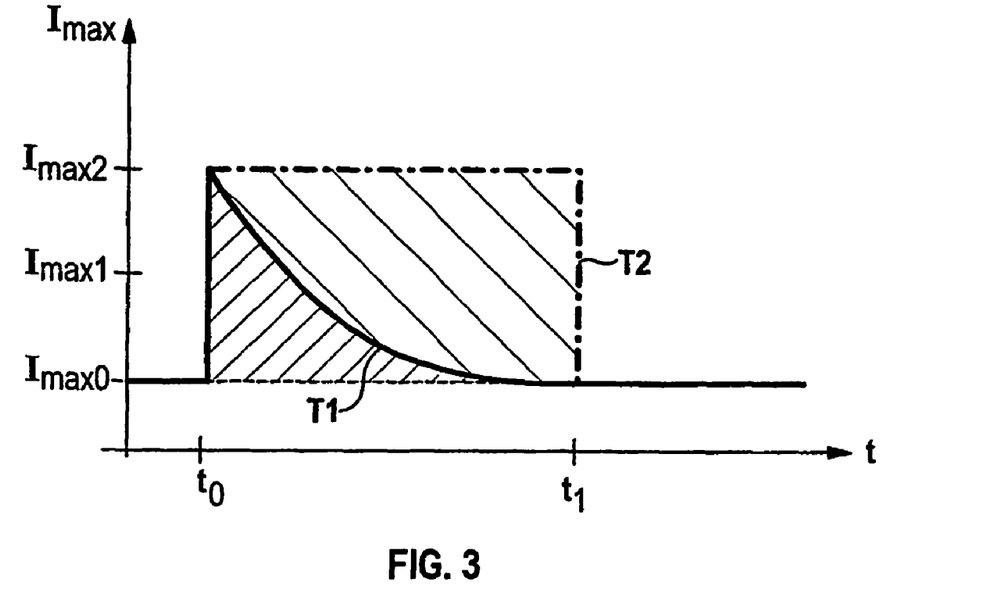
Figure 4:
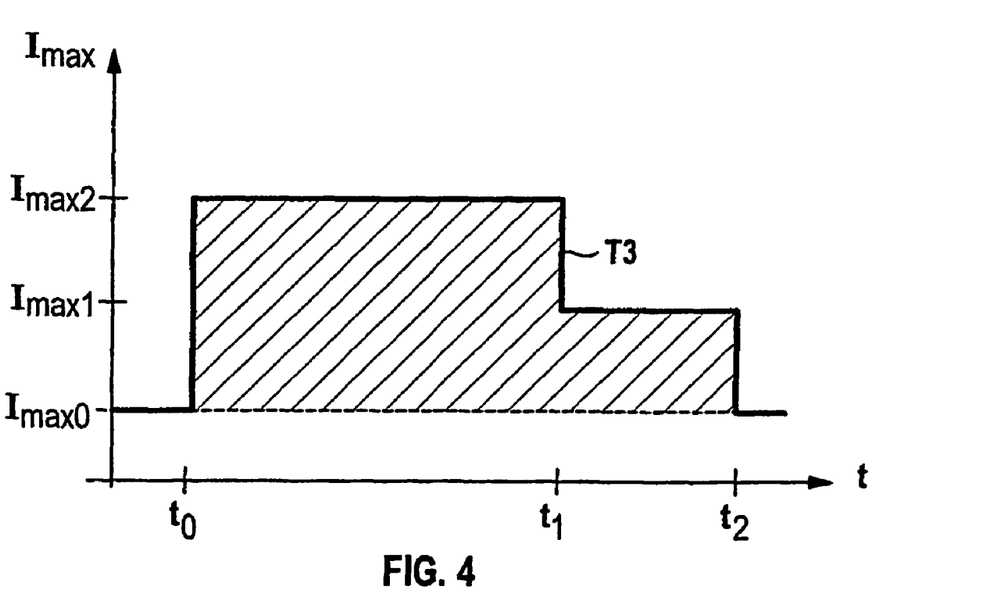

FIG. 3 and FIG. 4 show different instances of driving for the maximum current $I_{max}$ of the JFET protection element 3 in accordance with FIG. 1 and hence the characteristic curve thereof in accordance with FIG. 2. In the diagrams in accordance with FIGS. 3 and 4, the maximum current (saturation current) $I_{max}$ of the JFET protection element 3 is illustrated as a function of time t. In FIG. 3, a solid line is used to show a time profile T1 and a dash-dotted line is used to show a second time profile T2 for the maximum current $I_{max} = I_{max}(t)$. A single time profile T3 is illustrated in FIG. 4.

Before a switch-on instant $t_0$, at which the switching element 2 is switched on, in all three control characteristic curves T1, T2 and T3, the maximum current $I_{max}$ is at its value $I_{max0}$, and the control voltage $U_S$ for the JFET protection element 3 is thus 0 V. At the switch-on instant $t_0$ or shortly afterward, the maximum current $I_{max}$ is increased by sudden change or at least very rapidly to the higher value $I_{max2}$ in that the control voltage $U_S$ for the JFET protection element 3 is increased to the value $U_{S2} > 0$ V.

In accordance with the time profile T1 in FIG. 3, the maximum current $I_{max}$ then falls exponentially again until the old low value $I_{max0}$ is reached again at the instant $t_1$. This profile T1 essentially corresponds to a driving in accordance with FIG. 1 with a discharging capacitor.

In accordance with the time profile T2 in FIG. 3, the maximum current $I_{max}$ is held at its increased value $I_{max2}$ and then decreased again by sudden change to the low value $I_{max0}$ at the instant $t_1$. This profile T2 is thus essentially binary.

In the case of the time profile T3 in accordance with FIG. 4, by contrast, the maximum current $I_{max}$ is held at its increased value $I_{max2}$ until an instant $t_1$. It is then decreased to the intermediate value $I_{max1}$ and is returned to the original low value $I_{max0}$ again, only at the instant $t_2$.

In all the exemplary embodiments in accordance with FIGS. 3 and 4, after the switch-on of the switching element 2, the current conductivity of the protection element 3 is increased and as a result the—depicted by hatching—increased maximum quantity of charge and hence electrical energy is conducted. Through adaptation of the time interval $t_2 - t_1$ and of the values $I_{max0}$ to $I_{max2}$, the currents required during the start-up operation of an electrical load can be permitted and, after the conclusion of the start-up operation, overcurrents can be limited again.

In all the embodiments, the protection element 3, on account of its properties mentioned, is preferably designed with higher dielectric strength than the switching element 2, and, to that end, is preferably formed with a semiconductor material having a high band gap of at least 2 eV or a high breakdown field strength of at least 1 000 000 V/cm. The preferred semiconductor material for the protection element 3 is, generally monocrystalline, silicon carbide (SiC), in particular of one or more predetermined polytypes, such as the β polytype (3C polytype) or an α polytype, e.g. the 4H, 6H or 15R polytype. However, the protection element 3 may also comprise a different semiconductor material, in particular silicon, and is then dimensioned correspondingly. Apart from a JFET, a MESFET and to a limited extent, also a MOSFET or IGBT are also taken into consideration as protection element 3.

Generally, the switching element 2 is designed as a semiconductor component based on silicon (Si) and may be designed not only as a MOSFET but also as a MESFET, thyristor, IGBT or MCT.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A switching device, comprising:
   at least one switching element, including a switched-off state and a switched-on state;
   at least one protection element including a control terminal, electrically connected in series with the switching element and adapted to limit the electric current flowing through a series circuit, including the at least one switching element and the at least one protection element, the electric current being limited to a maximum current; and
   control means for controlling the maximum current of the protection element by applying a control signal to a control terminal of the at least one protection element and; wherein
   the maximum current of the protection element, at least on average with respect to time, is controlled at least one of in response to, and in a time-delayed manner with respect to, the switch-on of the at least one switching element to at least one increased value for a start operation and subsequently to at least one lower value for continuous operation.

2. The switching device as claimed in claim 1, wherein the control means at least one of increases the maximum current, and holds it at the at least one increased value, for a time interval.

3. The switching device as claimed in claim 2, wherein the time interval corresponds to at least one of start-up time and start time required in the event of at least one of the start-up and start of an electrical load.

4. The switching device as claimed in claim 1, wherein the at least one protection element, by virtue of the current limiting, protects the switching element in the switched-on state, from an excessively high thermal loading in a jeopardizing situation in which excessively high overcurrents or short-circuit currents flow through the switching element.

5. The switching device as claimed in claim 1, wherein the control means controls the maximum current of the protection element between one lower value and one increased value.

6. The switching device as claimed in claim 5, wherein the control means controls the maximum current of the protection element at least one of between the increased value and the lower value and between the lower value and the increased value discontinuously.

7. The switching device as claimed in claim 5, wherein the control means controls the maximum current of the protection element at least one of between the increased value and the lower value and between the lower value and the increased value continuously.

8. The switching device as claimed in claim 1, wherein the control means at least one of increases the maximum current of the protection element and holds the maximum current of the protection element at an increased level, in accordance with a temporal profile.

9. The switching device as claimed in claim 1, wherein at least one of the increased value and the temporal profile corresponds to at least one of a start-up current, a start current, and a temporal profile thereof associated with start-up or start of an electrical load.

10. The switching device as claimed in claim 9, wherein the lower value of the maximum current of the protection element corresponds to a maximum permissible overcurrent of the electrical load in operation after the end of at least one of the start-up and start of the electrical load.

11. The switching device as claimed in claim 1, wherein the increased value of the maximum current of the protection element is significantly lower than a prospective short-circuit current.

12. The switching device as claimed in claim 1, wherein the increased value of the maximum current of the protection element is greater than the lower value by at least a factor of 2.

13. The switching device as claimed in claim 1, wherein the control means includes at least one capacitor for generating a control signal for the protection element, the control signal corresponding to the increased value of the maximum current of the protection element.

14. The switching device as claimed in claim 13, wherein the control means includes at least one discharge resistor.

15. The switching device as claimed in claim 13, wherein the control means includes an auxiliary energy source for charging the capacitor.

16. The switching device as claimed in claim 15, wherein the control means includes a charging switch connected between the auxiliary energy source and the capacitor.

17. The switching device as claimed in claim 16, wherein the charging switch and the switching element are switchable such that the charging switch is in a switched-off state if the switching element is in a switched-on state, and the charging switch is in a switched-on state if the switching element is in a switched-off state.

18. The switching device as claimed in claim 14, wherein the control means includes a discharge switch, connected between the capacitor and the control terminal of the protection element.

19. The switching device as claimed in claim 18, wherein the discharge switch is also connected between capacitor and discharge resistor.

20. The switching device as claimed in claim 18, wherein the discharge switch and the switching element are switchable such that the discharge switch is in a switched-on state if the switching element is in a switched-on state, and the discharge switch is in a switched-off state if the switching element is in a switched-off state.

21. The switching device as claimed in 1, wherein the switching element has at least one switching terminal and switching signal generating means are provided for applying a switching signal to the switching terminal of the switching element for switching the switching element on and off.

22. The switching device as claimed in claim 21, wherein the switching signal generating means also applies the switching signal to at least one of a switching terminal of the charging switch and of the discharge switch.

23. The switching device as claimed in claim 17, wherein the charging switch and the and the discharge switch each include at least one MISFET structure and the discharge switch includes at least one MISFET structure.

24. The switching device as claimed in claim 1, wherein the protection element comprises a semiconductor component having at least one semiconductor having a breakdown field strength of at least $10^6$ V/cm and/or a band gap of at least 2 eV.

25. The switching device as claimed in claim 1, wherein the switching element includes a semiconductor component having at least one semiconductor from the group of semiconductors consisting of silicon, gallium arsenide, germanium.

26. The switching device as claimed in claim 1, wherein the protection element has a saturation behavior and the maximum current is the saturation current.

27. The switching device as claimed in claim 1, wherein the protection element includes at least one pn junction and at least one Schottky junction.

28. The switching device as claimed in claim 1, wherein at least one of the protection element and the switching element includes at least one JFET structure.

29. The switching device as claimed in claim 1, wherein at least one of the protection element and the switching element includes at least one MESFET structure.

30. The switching device as claimed in claim 1, wherein the switching element includes at least one MISFET structure.

31. The switching device as claimed in claim 28, wherein the gate terminal of at least one of a JFET structure and a MESFET structure of the protection element is connected to the source terminal of a MISFET structure of the switching element via the discharge resistor, and the source terminal of at least one of the JFET structure and MESFET structure is connected to the drain terminal of the MISFET structure.

32. The switching device as claimed in claim 1, wherein the maximum current of the protection element is less than a thermal limiting current of the switching element.

33. A method for operating a switching device including at least one switching element that is switchable on and off, at least one protection element electrically connected in series with the switching element and adapted to limit electric current flowing through a series circuit including the at least one switching element and at least one protection element to a maximum current, and a control terminal, to which a control device is adapted to apply a control signal, the method comprising:
   a) at least holding the maximum current of the at least one protection element, at least on average with respect to time, at an increased value, at least one of at the same time as and for a time interval after switch-on of the switching element for the start operation; and
   b) reducing the maximum current of the at least one protection element, subsequently thereafter, for continuous operation.

34. The method as claimed in claim 33, wherein the maximum current is at least held at the increased value, for at least the time interval.

35. The method as claimed in claim 34, wherein the time interval during which the at least one increased value of the maximum current of the protection element is maintained corresponds to at least a start-up time or start time associated with a start-up or start of an electrical load.

36. The method as claimed in claim 33, wherein the maximum current of the protection element is controlled between at least one of one lower value and one increased value and the lower value and the increased value.

37. The method as claimed in claim 36, wherein the maximum current is reduced from the increased value in a manner essentially falling monotonically to the lower value.

38. The method as claimed in claim 33, wherein the maximum current of the protection element is at least held at an increased value, in accordance with a temporal profile.

39. The method as claimed in claim 33, wherein at least one of the increased value and a temporal profile associated with the maximum current of the protection element corresponds to at least one of a start-up current and a start current associated with a start-up and start of an electrical load.

40. The method as claimed in claim 39, wherein the lower value of the maximum current of the protection element corresponds to the maximum permissible overcurrent of the electrical load after the end of at least one of the start-up and start of the electrical load.

41. The method as claimed in claim 33, wherein the increased value of the maximum current of the protection element is set such that it is significantly lower than a prospective short-circuit current.

42. The method as claimed in claim 33, wherein the increased value of the maximum current of the protection element is set such that it is greater than the lower value by at least a factor of 2.

43. The switching device as claimed in claim 5, wherein the control means controls the maximum current of the protection element at least one of between the increased value and the lower value and between the lower value and the increased value by abrupt change.

44. The switching device as claimed in claim 1, wherein the increased value of the maximum current of the protection element is greater than the lower value by at least a factor of 3.

45. The switching device as claimed in claim 13, wherein the control means includes at least one discharge resistor connected in parallel with the capacitor.

46. The switching device as claimed in claim 14, wherein the control means includes an auxiliary energy source for charging the capacitor.

47. The switching device as claimed in claim 13, wherein the control means includes a discharge switch, connected between the capacitor and the control terminal of the protection element.

48. The switching device as claimed in claim 17, wherein the charging switch includes at least one MOSFET structure, and the discharge switch includes at least one MOSFET structure.

49. The switching device as claimed in claim 17, wherein the charging switch includes at least one MOSFET structure of the normally on type, and the discharge switch includes at least one MOSFET structure of the normally off type.

50. The switching device as claimed in claim 1, wherein the protection element comprises a semiconductor component having at least one semiconductor having a breakdown field strength of at least $10^6$ V/cm and/or a band gap of at least 2 eV, comprises at least one semiconductor from the group of semiconductors consisting of silicon carbide of the α or β polytype, gallium nitride, diamond, aluminum nitride and indium nitride.

51. The switching device as claimed in claim 1, wherein the switching element includes at least one MOSFET structure of the normally off type.

52. The switching device as claimed in claim 1, wherein the maximum current of the protection element is less than a thermal limiting current of the switching element by at least a factor of 2.

53. The switching device as claimed in claim 1, wherein the maximum current of the protection element is less than a thermal limiting current of the switching element by at least a factor of 3.

54. The method as claimed in claim 33, wherein the increased value of the maximum current of the protection element is set such that it is lower than a prospective short-circuit current by at least a factor of 3.

55. The method as claimed in claim 33, wherein the increased value of the maximum current of the protection element is set such that it is greater than the lower value by at least a factor of 3.

* * * * *